(12) United States Patent
Yang et al.

(10) Patent No.: US 7,123,040 B2
(45) Date of Patent: Oct. 17, 2006

(54) SYSTEM AND METHOD FOR CHECK-IN CONTROL IN WAFER TESTING

(75) Inventors: Keng-Chia Yang, Chung-Hwa (TW); Chih-Chien Chen, Jhuangwei Township, Yilan County (TW); Let-Long Chen, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 48 days.

(21) Appl. No.: 10/793,441

(22) Filed: Mar. 4, 2004

(65) Prior Publication Data

US 2005/0194987 A1 Sep. 8, 2005

(51) Int. Cl.
*G01R 31/26* (2006.01)
(52) U.S. Cl. ...................................................... 324/765
(58) Field of Classification Search ...................... None
See application file for complete search history.

(56) References Cited

U.S. PATENT DOCUMENTS

| | | | | |
|---|---|---|---|---|
| 6,072,325 | A * | 6/2000 | Sano ........................... | 324/758 |
| 6,097,204 | A * | 8/2000 | Tanaka et al. .............. | 324/765 |
| 6,111,421 | A * | 8/2000 | Takahashi et al. .......... | 324/758 |
| 6,684,125 | B1* | 1/2004 | Kahn et al. .................. | 700/218 |
| 6,862,495 | B1* | 3/2005 | Kahn et al. .................. | 700/218 |
| 6,937,753 | B1* | 8/2005 | O'Dell et al. ................. | 438/16 |
| 2004/0234362 | A1* | 11/2004 | Iijima et al. .............. | 414/222.1 |

FOREIGN PATENT DOCUMENTS

JP         10090367 A   *   4/1998

* cited by examiner

*Primary Examiner*—Jermele Hollington
(74) *Attorney, Agent, or Firm*—Thomas, Kayden, Horstemeyer & Risley

(57) ABSTRACT

A testing system for check-in control in wafer testing. The testing system comprises a testing tool, an optical character recognition (OCR) device, and a controller. The testing tool performs a testing process of an article. The OCR device reads optical characters disposed on the article. The controller, connected to the testing tool and the OCR device, automatically initiates a check-in process for the article according to the read optical characters.

10 Claims, 4 Drawing Sheets

SYSTEM AND METHOD FOR CHECK-IN CONTROL IN WAFER TESTING

BACKGROUND

The present invention relates to wafer testing and particularly to a system providing check-in control in wafer testing.

Certain product families require wafers to be 100% tested before sawing. This "on-wafer" test allows device characterization and assurance of known good die for higher integration level products and die sales. At the end of wafer fabrication, all devices on a wafer undergo a performance test to identify faulty ICs. This provides customers with the ability to receive parts that meet their specifications.

Before wafer testing starts, a check-in process is performed to confirm wafer lot ID and corresponding test recipe. In a conventional wafer testing system, a cassette is delivered to circuit probe (CP) equipment, and lot and equipment IDs are input to a manufacturing executive system (MES) manually. The MES receives the lot and equipment IDs and performs a check-in process accordingly. The check-in process confirms the equipment to perform testing for the wafer lot and generates a list of allowable test recipes for an operator to choose from.

Such conventional wafer testing has two major disadvantages.

First, manual check-in for wafers requires additional manpower expended in inputting data and selecting test recipes.

Furthermore, the process is based on lot ID, providing a lot-based recipe control. The lot-based recipe control cannot meet the needs of smaller orders for various products. Accordingly, wafers in the same lot are processed using the same test recipe. The single recipe limitation places restrictions on test operation, resulting in inefficiency in wafer testing.

Hence, there is a need for a wafer testing control system that addresses the shortcomings of the existing technology.

SUMMARY

It is therefore an object of the invention to provide an improved system and method of check-in control to facilitate wafer testing progress.

To achieve these and other objects, the present invention provides an OCR-based test control mechanism.

According to the invention, a testing system is provided within a fabrication system. The system comprises a testing tool, an optical character recognition (OCR) device, and a controller.

The testing tool performs testing on an article. The OCR device reads optical characters disposed on the article. The controller, connected to the testing tool and the OCR device, automatically initiates a check-in process for the article according to the read optical characters.

The invention also provides a method for controlling the testing process to accomplish the aforementioned automatic check-in process. The method initiates a check-in process for an article according to optical characters disposed on the article in response to receipt of the article. The optical characters provide identification. First, optical characters disposed on the article are read. Next, a check-in process for the article is performed accordingly. When the check-in process is accomplished, a process command is issued to implement a testing process.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION

The present invention will now be described with reference to FIGS. 1 to 4, which in general relate to a wafer testing system. While the preferred embodiment of the invention operates with wafer testing systems, it is understood that the type of article inspected by the testing system is not critical to the present invention, and any testing system performing a check-in process prior to a testing process may operate with the present invention.

Figure 1:
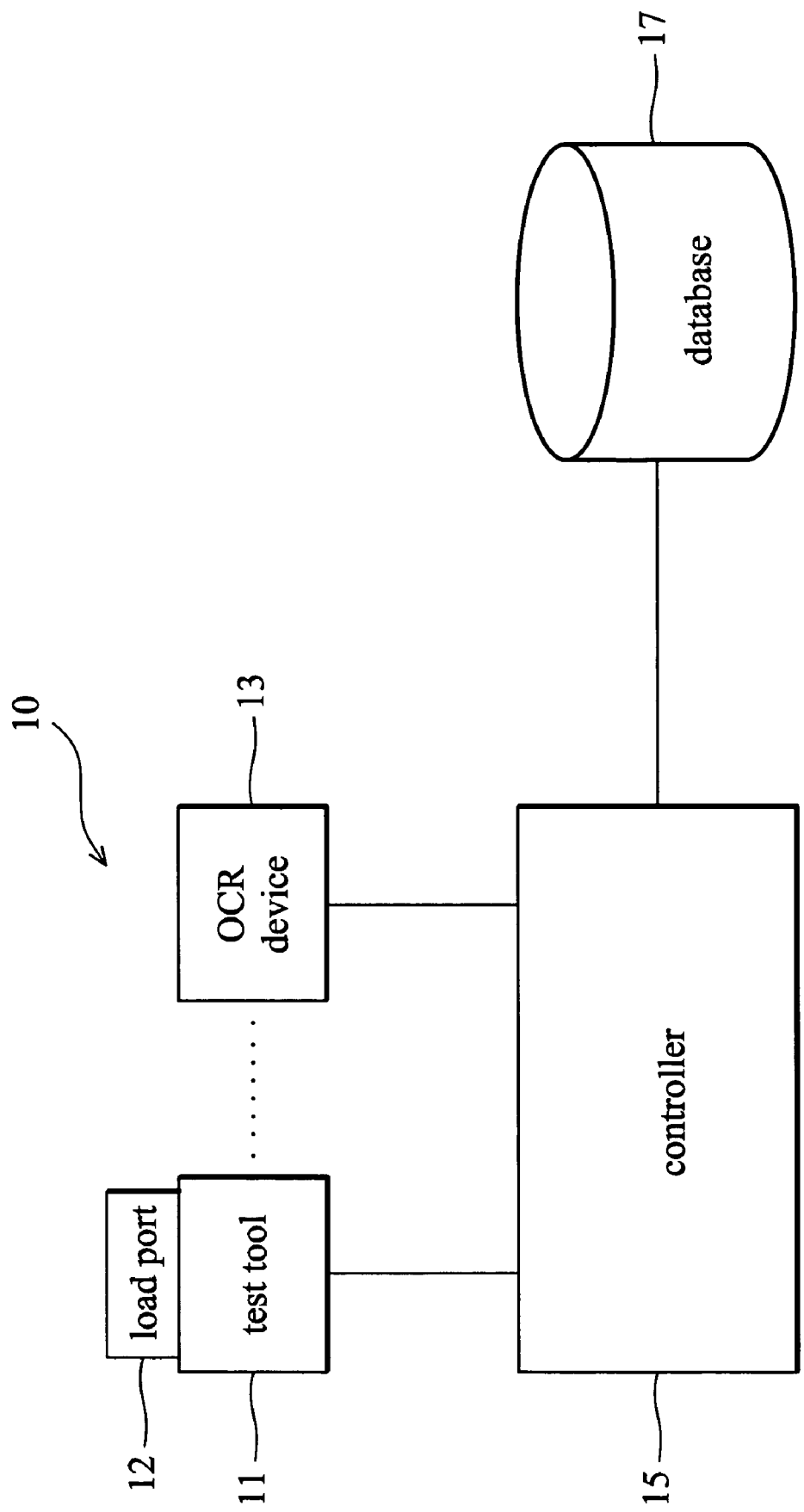
FIG. 1 is a schematic view showing the system of wafer testing control according to an embodiment of the present invention.

FIG. 1 is a schematic view showing the wafer testing system according to the present invention. A testing system 10 is a wafer testing system comprising testing tool 11, OCR device 13, controller 15, and database 17.

The testing tool 11 performs a testing process, such as a circuit probe process, on a wafer. Testing tool 11 has a load port 12 serving as an interface for wafers moving into and out of the testing tool 11 before and after a testing process respectively. The load port 12 is connected to a transport device in a fabrication system.

The OCR device 13 reads optical characters disposed on a wafer. The optical characters specify identification information of the wafer, such as wafer ID. OCR device 13 reads wafer ID immediately in response to receipt of the wafer.

Controller 15, connected to testing tool 11 and OCR device 13, initiates and accomplishes a check-in process for the wafer according to the wafer ID read by OCR device 13. In the check-in process, the wafer ID is verified and a suitable test recipe is selected accordingly. When the check-in process is accomplished, controller 15 transmits a process command to testing tool 11 to implement a testing process.

Database 17 stores information related to wafer verification and recipe selection, such as a testing process model including a test recipe and a tool setup file.

Figure 2:
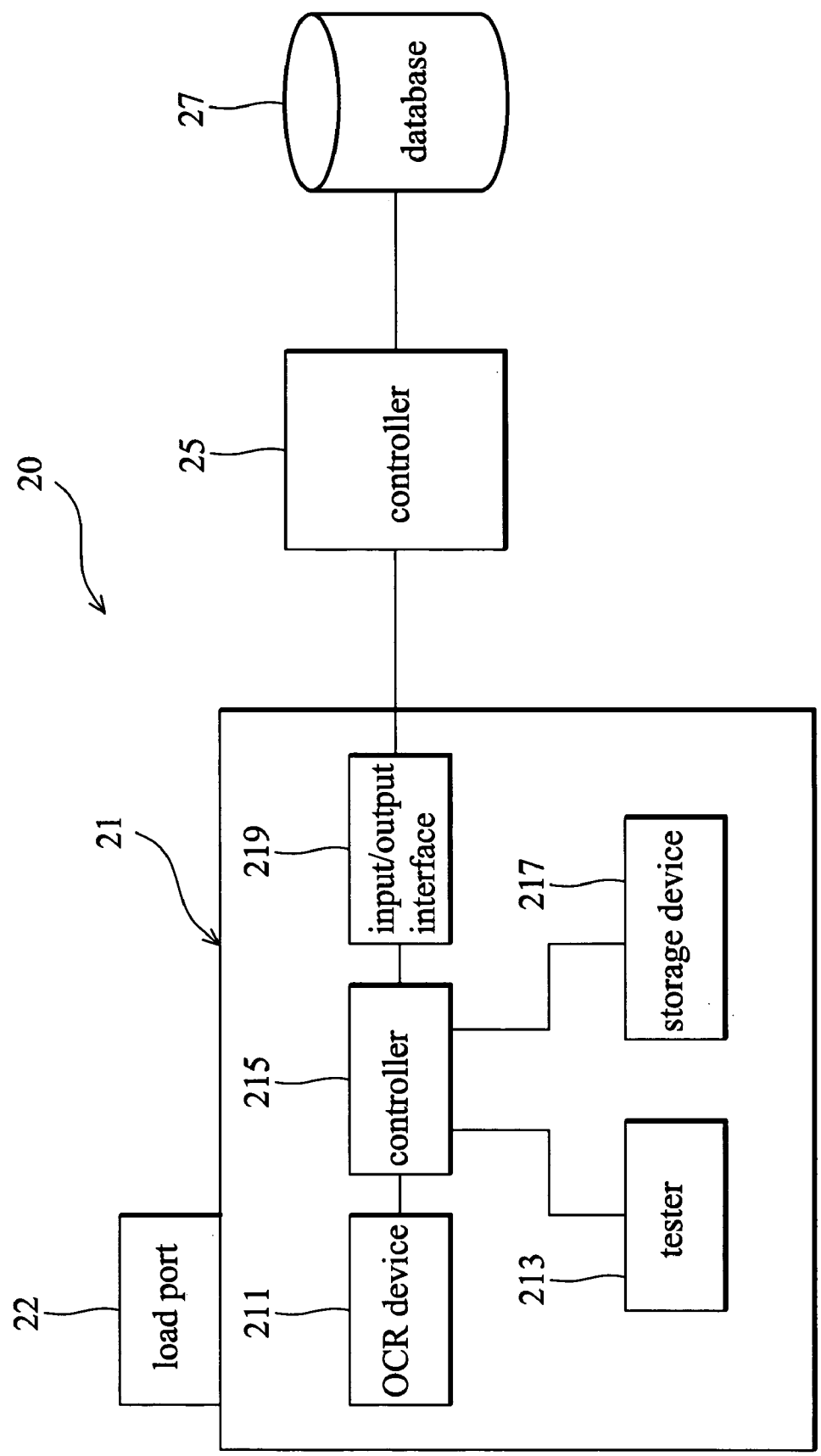
FIG. 2 is a schematic view showing the system of wafer testing control according to another embodiment of the present invention.

FIG. 2 is a schematic view showing the wafer testing system according to another embodiment of the present invention, wherein the check-in process is initiated by a testing tool and accomplished in a MES of a fabrication system. Fabrication system 20 comprises circuit probe (CP) equipment 21, a MES 25, and a database 27. CP equipment 21 comprises load port 22, OCR device 211, controller 215, tester 213, storage device 217, and input/output interface 219. MES 25, connected to CP equipment 21 and database 27, receives a check-in request from CP equipment 21, retrieves information needed in the check-in process from database 27, and performs the check-in process accordingly.

When a wafer is loaded into the CP equipment 21 through the load port 22, OCR device 211 reads optical characters disposed on the wafer. The optical characters specify identification information of the wafer, such as wafer ID. Then the wafer ID is sent to controller 215 directing a check-in initiation thereof. The controller 215 sends a check-in request to MES 25 through input/output interface 219. MES 25 starts a check-in process according to the check-in request and sends a test command when the check-in process is accomplished. The CP equipment 21 receives the test command, verifies a test recipe stored in storage device 217, and performs a testing process accordingly.

Figure 3:
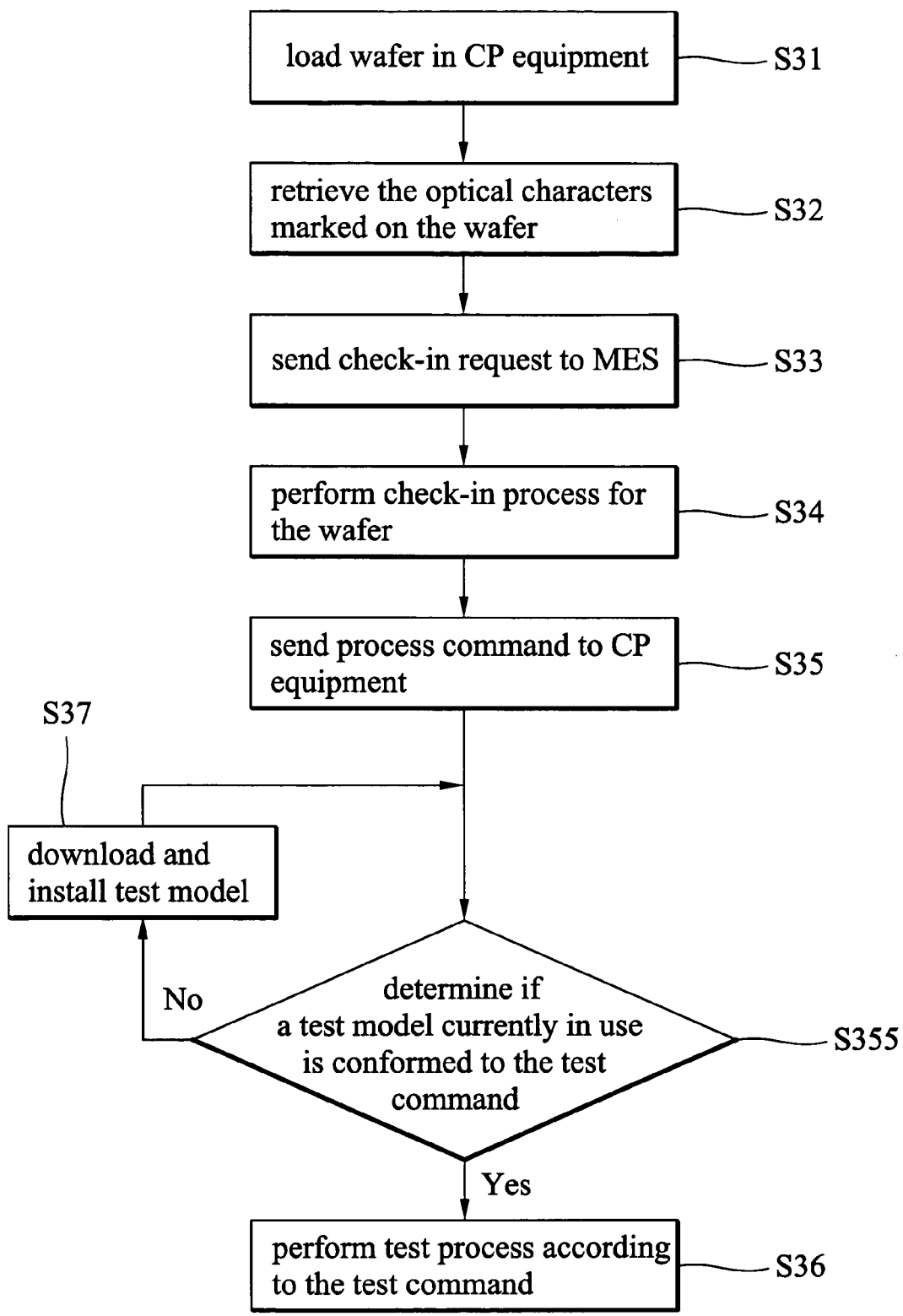
FIG. 3 is flowchart showing the operation of testing control method of the present invention.

FIG. 3 is flowchart showing the test control method of the present invention. The method shown in FIG. 3 is implemented in the system of FIG. 2. A wafer is loaded in CP equipment 21 in step S31. The wafer has wafer ID inscribed on its side as optical characters. Then the optical characters disposed on the wafer are read by OCR device 211 (step S32). Then, a check-in request is sent to MES 25 (step S33). A check-in process for the wafer is performed in MES according to the optical character (step S34). When the check-in process is accomplished, a process command is sent to CP equipment 21 (step S35). When the test command is sent to CP equipment 21, it is determined if a test model currently in use conforms to the test command (step S355), and if so, the method proceeds to step S36, otherwise to step S37. In step S36, a testing process is performed according to the test command. In step S37, a test model is downloaded from database 27 and installed in CP equipment 21. After the correct test model is installed in CP equipment 21, the method proceeds to step S36.

An example showing the operation of system of FIG. 2 and the progress of the method of FIG. 3 is now described. A cassette containing 25 wafers is loaded into CP equipment 21 through load port 22, wherein the wafers belong to a wafer lot having a lot ID of "Q12345.1". When one of the wafers is mounted on the CP equipment 21, its wafer ID is read by OCR device 211. The wafer ID is "Q12345-01-X", wherein "Q12345" represents the lot the wafer belongs to and the X represents a checksum number. The checksum number can be obtained by any known method. Then the wafer ID is sent to MES 25 through input/output interface 219. MES 25 performs a lot verification process in response to receipt of the wafer ID. When the wafer ID is verified in the lot verification process, related information is read from database 27 and sent to CP equipment 21. The related information includes lot ID ("Q12345.1"), test recipe name ("TM6108BEBZ6"), and probe setup file name ("TM6108B-1X4"). The related information is included in a test command and sent to CP equipment 21. When CP equipment 21 receives the test command and related information, it is first determined whether a test recipe and probe setup file currently in use conforms to the test recipe name and probe setup file name specified in the test command, and if so, a testing process is performed accordingly, otherwise a test recipe and probe setup file as defined in the test command are downloaded from the database 27 through MES 25. After the specified test recipe and probe setup file are downloaded and installed in the CP equipment 21, a testing process is performed accordingly.

The method of the present invention, or certain aspects or portions thereof, may take the form of program code (i.e. instructions) embodied in a tangible media, such as floppy diskettes, CD-ROMS, hard drives, or any other machine-readable storage medium, wherein, when the program code is loaded into and executed by a machine, such as a computer, the machine becomes an apparatus for practicing the invention. The methods and apparatus of the present invention may also be embodied in the form of program code transmitted over some transmission medium, such as electrical wiring or cabling, through fiber optics, or via any other form of transmission, wherein, when the program code is received and loaded into and executed by a machine, such as a computer, the machine becomes an apparatus for practicing the invention. When implemented on a general-purpose processor, the program code combines with the processor to provide a unique apparatus that operates analogously to specific logic circuits.

Figure 4:
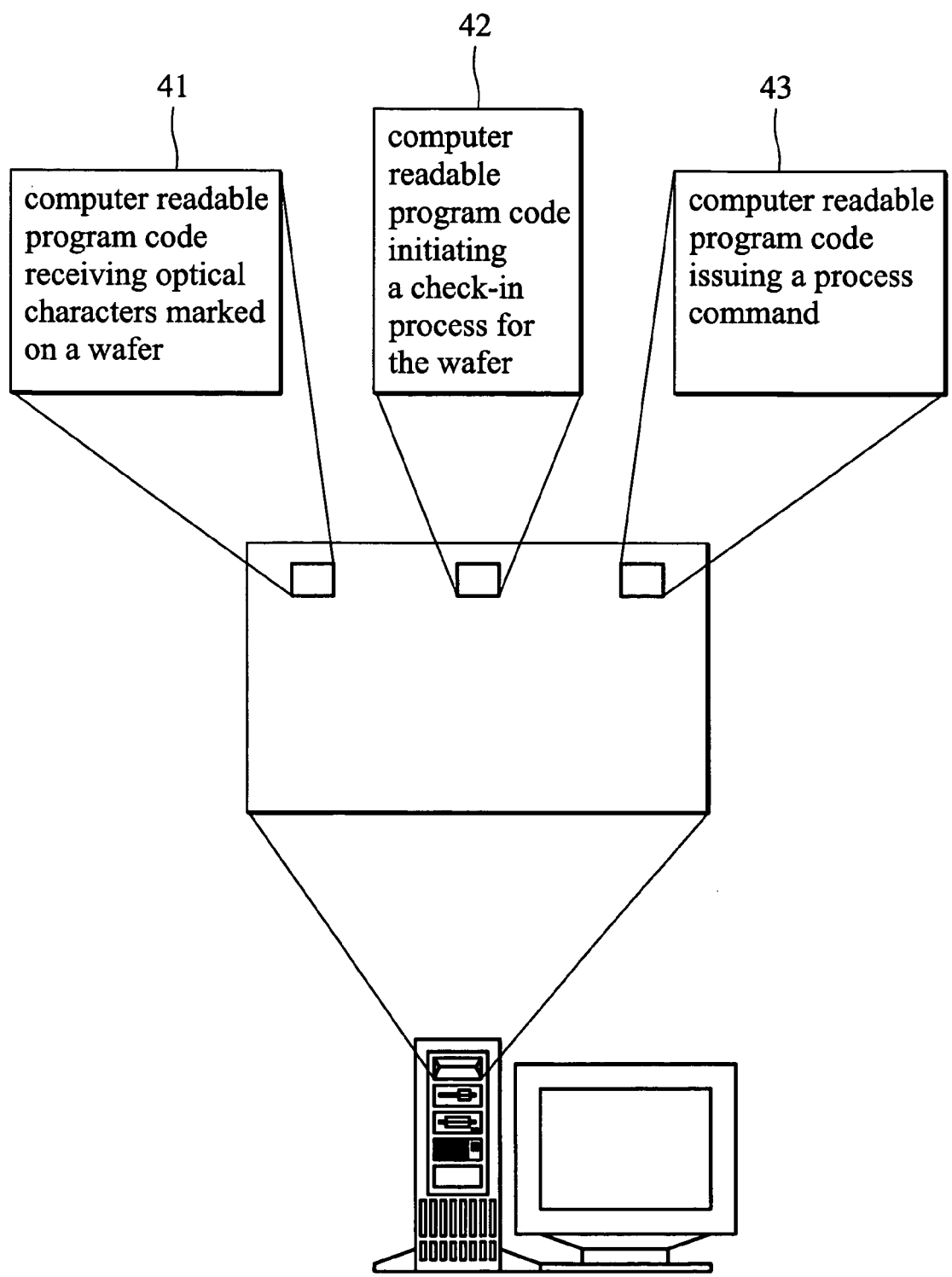
FIG. 4 is a diagram of a storage medium storing a computer program providing the test control method.

FIG. 4 is a diagram of a storage medium storing a computer program providing the test control method according to the present invention. The computer program product comprises a computer usable storage medium having computer readable program code embodied in the medium, the computer readable program code comprising computer readable program code 41 receiving optical characters disposed on a wafer, computer readable program code 43 initiating a check-in process for the wafer according to the optical characters, and computer readable program code 45 issuing a process command when the check-in process is accomplished.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A testing system, comprising:
    a testing tool performing a testing process for an article;
    an optical character recognition (OCR) device reading optical characters disposed on the article; and
    a controller, connected to the testing tool and the OCR device, automatically performing a check-in process for the article upon receipt of the optical characters according to the read optical characters, and transmitting a process command to the testing tool to perform a testing process after the check-in process is completed.

2. The system of claim 1, wherein the testing tool is a circuit probe.

3. The system of claim 1, wherein the article is a wafer.

4. The system of claim 3, wherein the optical characters specify a wafer ID.

5. The system of claim 1, further comprising a storage device storing a testing process model comprising a test recipe and a probe setup file.

6. The system of claim 5, wherein the process command comprises a wafer lot ID.

7. The system of claim 5, wherein the process command comprises a test recipe name.

8. The system of claim 5, wherein the process command comprises a probe setup file name.

9. The system of claim 5, wherein the testing tool further determines whether a current test recipe conforms to the test recipe name as defined in the process command, and, if not, retrieves a test recipe from the storage device accordingly.

10. The system of claim 5, wherein the testing tool further determines whether a current probe setup file conforms to the probe setup file name as defined in the process command, and, if not, retrieves a probe setup file from the storage device accordingly.

* * * * *